United States Patent [19]
Iwata et al.

[11] 3,984,751
[45] Oct. 5, 1976

[54] HIGH D.C. VOLTAGE GENERATING APPARATUS

[75] Inventors: Koji Iwata; Wataru Otagiri, both of Hitachi; Junichi Masuda, Nagareyama, all of Japan

[73] Assignee: Hitachi, Ltd., Japan

[22] Filed: Oct. 24, 1974

[21] Appl. No.: 517,744

[30] Foreign Application Priority Data
Nov. 12, 1973 Japan............................. 48-126306

[52] U.S. Cl. .............................. 321/45 C; 307/104; 307/252 M
[51] Int. Cl.² ........................................ H02M 7/17
[58] Field of Search................. 321/5, 43, 44, 45 C; 307/104, 252 M; 318/345

[56] References Cited
UNITED STATES PATENTS

| | | | |
|---|---|---|---|
| 3,538,419 | 11/1970 | Seki et al.......................... | 321/45 C |
| 3,614,586 | 10/1971 | King.................................. | 321/45 C |
| 3,646,398 | 2/1972 | Kotos................................ | 321/45 C |
| 3,748,560 | 7/1973 | Sawa et al........................ | 321/45 C |
| 3,872,364 | 3/1975 | Hubner............................. | 321/45 C |
| 3,919,622 | 11/1975 | Alnema et al.................... | 321/45 C |

*Primary Examiner*—Gerald Goldberg
*Attorney, Agent, or Firm*—Craig & Antonelli

[57] ABSTRACT

A high D.C. voltage generating apparatus for generating a high D.C. voltage across an inductive load, in which a circuitry serving to supply a D.C. current to the load and a circuitry serving to generate a high D.C. voltage across the load are separated from each other, so that the current and voltage capacity required for the respective circuitries is reduced and disturbance in the power supplying side is eliminated.

4 Claims, 6 Drawing Figures

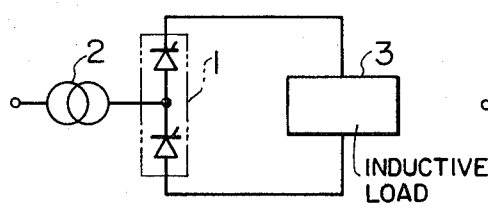
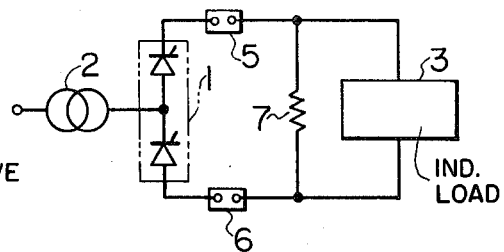
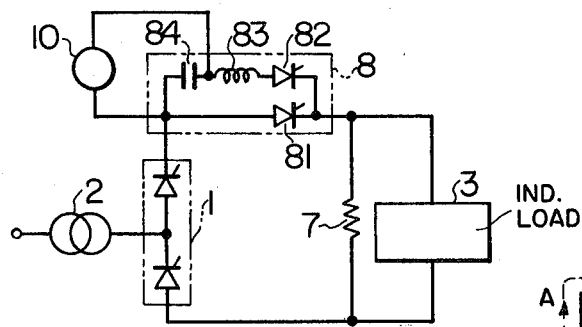
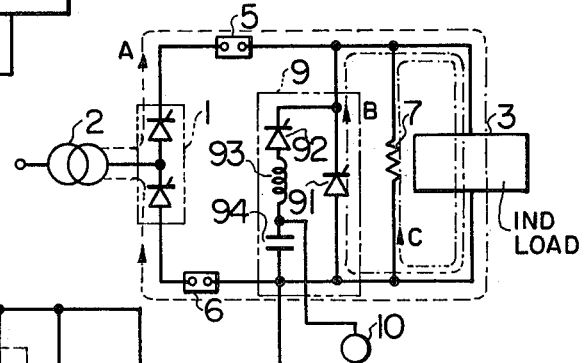
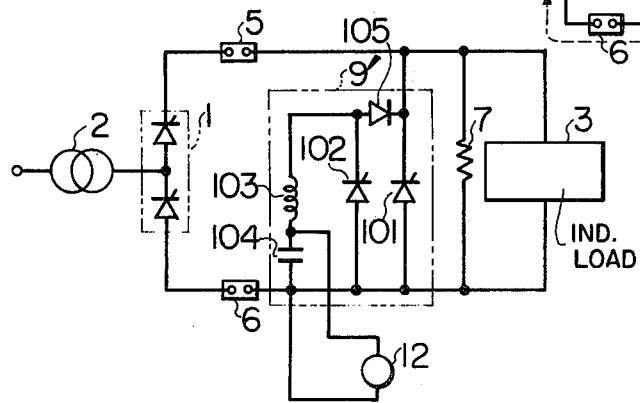

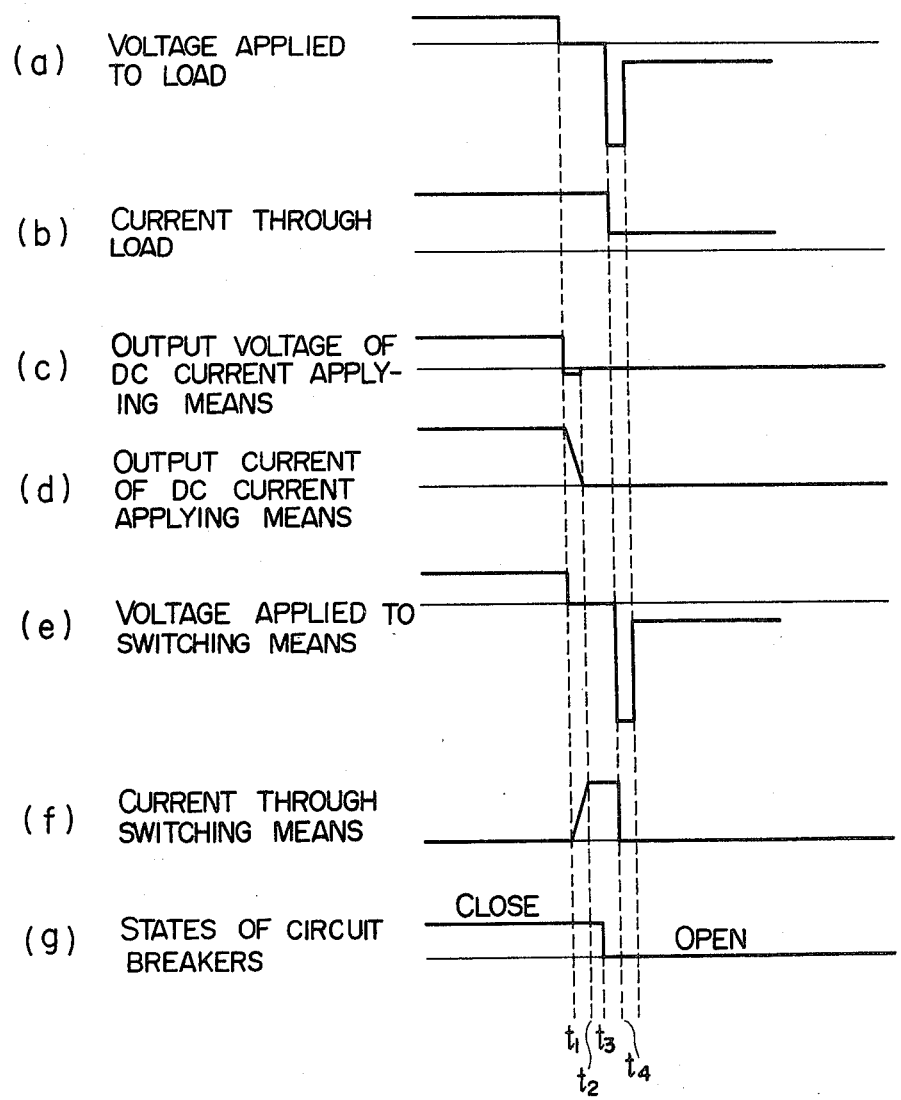

HIGH D.C. VOLTAGE GENERATING APPARATUS

BACKGROUND OF THE INVENTION

The present invention relates to a high D.C. voltage generating apparatus for the power source of a plasma generating apparatus by nuclear fusion, for example.

In a high D.C. voltage generating apparatus for the power source of a plasma generating apparatus by nuclear fusion, etc., it is necessary to reduce a D.C. current supplied to an inductive lead in an extremely short time compared with the time constant of the load, thereby generating in a short time a high D.C. voltage in the order of 100 times of the initial supplying voltage.

As this type of high D.C. voltage generating apparatus, there may be considered an apparatus in which a D.C. current is directly supplied to an inductive load from a thyristor converter means acting as an inverter and the thyristor converter means generates a negative voltage, thereby generating a high voltage across the load. When such an apparatus is large in scale, an extraordinarily large capacity is required. The apparatus of such a large capacity, however, encounters a difficulty in manufacturing thereof from a technical and economic viewpoint.

For solving such problems, there may be considered a high D.C. voltage generating apparatus additionally provided with a D.C. breaker means between the thyristor converter means and the load. When this apparatus is large in scale, however, there also exists a problem in producing the D.C. breaker means due to its current-carrying capacity and its breaking or interrupting capacity. There may be considered another high D.C. voltage generating apparatus provided with a switching means using thyristors in place of such a D.C. breaker means. But, this switching means requires a large current and high voltage capacity, and thus the manufacture of it is difficult.

SUMMARY OF THE INVENTION

Accordingly, an object of the present invention is to provide a high D.C. voltage generating apparatus in which such problems are eliminated, the effective capacities of the respective circuitries are reduced and disturbance in the power supplying said is eliminated.

The above object is achieved by separating the circuitry serving to supply a D.C. current to an inductive load and the circuitry serving to generate a high voltage across the load.

BRIEF DESCRIPTION OF THE DRAWING

FIGS. 1 to 3 show schematic circuit diagrams of examples of high D.C. voltage generating apparatuses, respectively.

FIG. 4 is a schematic circuit diagram of a high D.C. voltage generating apparatus according to the present invention.

FIG. 5 is a time chart for illustrating the operation of the high D.C. voltage generating apparatus shown in FIG. 4.

FIG. 6 is a schematic circuit diagram of another embodiment of the high D.C. voltage generating apparatus according to the present invention.

DESCRIPTION OF THE PREFERRED EMBODIMENTS

Reference is first made to FIGS. 1 to 3 illustrating examples of apparatusses which may be considered as high D.C. voltage generators, but which do not have the features of the present invention. In these figures, like reference numerals refer to like parts.

FIG. 1 shows a high D.C. voltage generating apparatus of small scale which includes an inductive load 3 and a D.C. current supplying means 1 to supply a D.C. current to the load 3. The connection to the D.C. current supplying means 1 is illustrated in the form of a skeleton or single-line diagram. However, it should be understood that the D.C. current supplying means 1 in a known manner generally comprises three-phase bridge-connected thyristors to which a three-phase current is inputted through a rectifier transformer 2 and from which a D.C. current is outputted. The D.C. current supplying means 1 operates as an inverter as well as for supplying the D.C. current to the load 3. In operation, in a state in which the D.C. current is supplied to the load 3, the D.C. current supplying means 1 operates as an inverter to generate a negative voltage and then to apply the high voltage to the load 3 and at the same time the energy stored in the load 3 is regenerated back to the power supply side through the D.C. current supplying means 1. However, when the apparatus of FIG. 1 is large in scale, the capacity required for the apparatus must be very large. The manufacturing of such a large capacity apparatus is almost impossible from a technical and economic viewpoint. Additionally, the energy or power supplied from the power supplying side sometimes reaches to the order of $10^6$ KVA and thus an extraordinary capacity is required for the power supplying side.

FIG. 2 shows another high D.C. voltage generating apparatus having D.C. breakers 5 and 6 provided between the D.C. current supplying means 1 and the inductive load 3 of the apparatus in FIG. 1. In FIG. 2, a resistor 7 provides a discharge path for the energy stored in the load 3. In operation, a D.C. current is supplied from the D.C. current supplying means 1 to the load 3 by closing the D.C. breakers 5 and 6. When the D.C. breakers 5 and 6 are then opened, the current flowing through the load 3 recirculates through a circuit of the load 3 and the resistor 7 so that a high voltage is generated across the load 3 by the current flowing through the resistor 7. In this apparatus, however, the D.C. breakers 5 and 6 must have a large current-carrying capacity and a large breaking capacity, and it is impossible to manufacture such D.C. breakers from a practical viewpoint.

FIG. 3 shows yet another high D.C. voltage generator using a switching means 8 instead of the D.C. breakers 5 and 6 in FIG. 2. The switching means 8 is comprised of a main thyristor 81 to cut off the D.C. current supplied from the D.C. current supplying means 1 to the inductive load 3, a commutating thyristor 82 to deenergize the main thyristor 81, a reactor 83 and a capacitor 84. The capacitor 84 is connected to a D.C. power source 10 to charge the capacitor. In operation of the switching means 8, the main thyristor 81, in response to the application of a trigger pulse to the gate thereof, permits the supply of a D.C. current from the D.C. current supplying means 1 to the load 3. When a trigger signal is applied to the gate of the commutating thyristor 82, the main thyristor 81 is turned off to stop the supply of the D.C. current to the load 3. However, in this apparatus, the switching means 8 must withstand a large current as well as a high voltage, i.e. it must have an excessive capacity. Thus, this apparatus will encounter a difficulty in manufacturing it.

The present invention has solved such problems mentioned above by separating a circuitry serving to supply a D.C. current to an inductive load and a circuitry serving to generate a high voltage across the load. The embodiments of the present invention will be described referring to FIGS. 4 to 6 in which like reference numerals are used to designate like parts in FIGS. 1 to 3.

FIG. 4 is an embodiment of a high D.C. voltage generator apparatus according to the present invention. In the figure, a switching means 9 is provided between the circuit breakers 5 and 6 and the inductive load 3 with which the switching means 9 is connected in parallel. The switching means 9 is comprised of a main thyristor 91, a series-connected circuit which is connected in parallel with the main thyristor 91 and comprises a commutating thyristor 92, a reactor 93 and a capacitor 94, and a D.C. power source 10 to charge the capacitor 94. The main thyristor 91 and the commutating thyristor 92 are connected in parallel so as to conduct in the same direction.

FIG. 5 is a time chart for illustrating the operation of the circuit construction shown in FIG. 4, in which (a) illustrates diagramatically the voltage applied to the load 3, (b) the D.C. current through the load 3, (c) the output voltage of the D.C. current supplying means 1, (d) the output current of the D.C. current supplying means 1, (e) the voltage applied to the switching means 9, (f) the current through the switching means 9, and (g) the operation of the circuit breakers 5 and 6.

Initially, a D.C. current flows from the D.C. current supplying means 1 to the inductive load 3 under a state in which the circuit breakers 5 and 6 are closed. A current flow path in this condition is shown by arrow A in FIG. 4. At the time $t_1$, the D.C. current supplying means 1 is operated in an inverter mode to produce a negative output voltage so that the output current is reduced, whereas a trigger signal is applied to the gate of the main thyristor 91 of the switching means 9 and hence the energy stored in the inductive load 3 flows as shown by arrow B, as a recirculating current between the main thyristor 91 and the load 3. The trigger signal may be applied to the main thyristor 91 after the time $t_1$. The current being supplied from the D.C. current supplying means 1 falls to zero at the time $t_2$, and thereafter the circuit breakers 5 and 6 are made to open at the time $t_3$. At the time $t_4$, a trigger signal is applied to the gate of the commutating thyristor 92 in the switching means 9. On the application of the trigger signal, the charged energy in the capacitor 94 supplied from the power source 10 begins to discharge, oscillating at the frequency determined by the reactor 93 and the capacitance 94 and to cut off said recirculating current thereby to turn off the main thyristor 91. As a result, a current flow, as shown by arrow C is provided through a circuit of the load 3 and the discharge resistor 7 so that a high voltage determined by the load 3 and the discharge resistor 7 appears across the load 3.

Thus, the function of the D.C. current supplying means 1 is merely to supply a D.C. current to the load 3 so that the capacity required for the D.C. current supplying means can be reduced. Further, since the circuit breakers 5 and 6 do not perform the absorption and cutting-off of the D.C. current, the structure of the circuit breakers can be made simple. The switching means 9 turns on only between the times $t_1$ and $t_4$, i.e. during a very short period. For this, to withstand the high voltage generated after the rapid current reduction suffices for the need of the thyristor switching means in the withstand voltage characteristic, thereby permitting the reduction of the current capacity.

In the circuit construction shown in FIG. 4, when the voltage applied to the load 3 is 700 V, the current through the load 3 is 50 KA and the resistance of the discharge resistor 7 is selected 1.4 $\omega$, a high voltage of about 70 KV is obtained. Normally, the time constant of the load 3 is 5 seconds and the current interrupting time is in the order of 50 milliseconds.

FIG. 6 shows another high D.C. voltage generating apparatus according to the present invention, employing another switching means 9' in place of the switching means 9 used in the apparatus in FIG. 4. The switching means 9' is comprised of a series circuit comprising a capacitor 104, a reactor 103 and a diode 105, a main thyristor 101 connected in parallel with the series circuit, and a commutating thyristor 102 connected in parallel with that portion of the series circuit including the capacitor 104 and the reactor 103. The main thyristor 101 and the commutating thyristor 102 are connected in parallel so as to be conductive in the same direction.

In operation, when the main thyristor 101 is turned on in response to the application of a trigger signal to the gate thereof, a part of the energy stored in the inductive load 3 flows as recirculating current in the circuit consisting of the main thyristor 101 and the load 3, while another part thereof flows in the path consisting of the load 3, the capacitor 104, the reactor 103 and the diode 105, thereby charging the capacitor 104. After the current supplied from the D.C. current supplying means 1 to the load 3 decreases to zero, the circuit breakers 5 and 6 are open. Thereafter, the commutating thyristor 102 is turned on. On the turning on of the commutating thyristor 102, the charge stored in the capacitor 104 discharges in its positive half-period through the capacitor 104, the commutating thyristor 102 and the reactor 103 and discharges in its negative half-period through the capacitor 104, the reactor 103, the diode 105 and the main thyristor 101 with the result that said recirculating current flowing through the main thyristor 101 is interrupted to extinguish the main thyristor 101. As a result, a high voltage whose amplitude is determined by the load 3 and the discharging resistor 7 is generated. By the way, reference numeral 12 designates a D.C. power source for compensating for the deficiency of charge in the capacitor 104.

Though in the embodiments shown in FIGS. 4 and 6 two separate circuit breakers 5 and 6 have been used, a single circuit breaker may be used which is able to simultaneously switch the circuit portions where the circuit breakers 5 and 6 are placed.

We claim:
1. A high D.C. voltage generating apparatus comprising an inductive load, a D.C. current supplying means connected in parallel with said load through a circuit breaker means for supplying a D.C. current to said load, a resistor connected in parallel with said load, and a switching means connected in parallel with said load between said load and said circuit breaker means, said switching means being turned on in a state in which said circuit breaker means is closed and the D.C. current is supplied to said load, said switching means being turned off after the D.C. current is reduced and said circuit breaker means is thereafter opened, so that the D.C. current recirculates through a circuit of said load and said resistor to generate a high D.C. voltage across said load.

2. A high D.C. voltage generating apparatus claimed in claim 1, in which said switching means comprises a first thyristor, a series circuit including a second thyristor, a reactor and a capacitor and connected in parallel with said first thyristor, said first and second thyristors being connected in parallel so as to conduct in the same direction, and a D.C. power source for supplying a charging energy to said capacitor, the energy supplied from said D.C. current supplying means to said load discharging as a recirculating current between said load and said first thyristor when said first thyristor is turned on, and said second thyristor being turned on after said circuit breaker means is opened, so that the charging energy stored in said capacitor discharges through said reactor and said second thyristor to interrupt said recirculating current.

3. A high D.C. voltage generating apparatus claimed in claim 1, in which said switching means comprises a series circuit including a capacitor, a reactor and a diode, a first thyristor connected in parallel with said series circuit, and a second thyristor connected in parallel with that portion of said series circuit including said capacitance and said reactor, said first and second being connected in parallel so as to conduct in the same direction, a part of the energy supplied from said D.C. current supplying means to said load discharging as a recirculating current between said load and said first thyristor when said first thyristor is turned on, another part of said energy flowing through said series circuit to charge said capacitor, said second thyristor being turned on after said circuit breaker means is opened, so that the energy stored in said capacitor discharges through said reactor and said diode to interrupt said recirculating current.

4. A high D.C. voltage generating apparatus claimed in claim 3, in which said switching means further comprises a D.C. power source for supplying a charging energy to said capacitor.

* * * * *